United States Patent
Tseng et al.

(10) Patent No.: US 10,720,214 B2
(45) Date of Patent: Jul. 21, 2020

(54) NON-VOLATILE MEMORY DEVICE AND METHOD FOR CONTROLLING THE NON-VOLATILE MEMORY DEVICE

(71) Applicant: TAIWAN SEMICONDUCTOR MANUFACTURING CO., LTD., Hsinchu (TW)

(72) Inventors: Yu-Wen Tseng, Chiayi (TW); Tsung-Yu Yang, Tainan (TW); Chung-Jen Huang, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/172,057

(22) Filed: Oct. 26, 2018

(65) Prior Publication Data

US 2019/0164613 A1 May 30, 2019

Related U.S. Application Data

(60) Provisional application No. 62/593,066, filed on Nov. 30, 2017.

(51) Int. Cl.

| G11C 16/10 | (2006.01) |
| G11C 16/04 | (2006.01) |
| H01L 27/11521 | (2017.01) |
| G11C 16/14 | (2006.01) |
| H01L 27/11526 | (2017.01) |
| H01L 29/788 | (2006.01) |

(Continued)

(52) U.S. Cl.
CPC .......... *G11C 16/10* (2013.01); *G11C 16/0433* (2013.01); *G11C 16/14* (2013.01); *H01L 27/11521* (2013.01); *H01L 27/11524* (2013.01); *H01L 27/11526* (2013.01); *H01L 29/42328* (2013.01); *H01L 29/7881* (2013.01); *G11C 2216/04* (2013.01)

(58) Field of Classification Search
CPC ..... G11C 16/10; G11C 16/14; G11C 16/0425; G11C 16/0433; G11C 2216/04; H01L 29/42328; H01L 27/11524; H01L 29/7881; H01L 29/788; H01L 27/11529; H01L 27/11521

See application file for complete search history.

(56) References Cited

U.S. PATENT DOCUMENTS

| 2002/0114185 A1* | 8/2002 | Blyth | G11C 16/0408 365/185.12 |
| 2013/0242659 A1* | 9/2013 | Yu | H01L 29/788 365/185.14 |
| 2015/0179749 A1* | 6/2015 | Chen | H01L 29/7881 365/185.18 |

* cited by examiner

*Primary Examiner* — David Lam
(74) *Attorney, Agent, or Firm* — Maschoff Brennan

(57) ABSTRACT

A memory unit includes a substrate and a floating gate memory cell. The floating gate memory cell includes an erase gate structure disposed on the substrate, floating gate structures select gates, a common source and drains. The common source is disposed in the substrate, and the erase gate structure is disposed on the common source. The floating gate structures protrude from recesses of the substrate at two opposite sides of the erase gate structure. A method for controlling the memory unit includes applying an erase gate programming voltage on the erase gate structure, applying a control gate programming voltage on the common source, applying a bit line programming voltage on the drains, and applying word line programming voltage on the select gates, in which the control gate programming voltage is greater than the erase gate programming voltage.

20 Claims, 8 Drawing Sheets

(51) Int. Cl.
*H01L 27/11524* (2017.01)
*H01L 29/423* (2006.01)

NON-VOLATILE MEMORY DEVICE AND METHOD FOR CONTROLLING THE NON-VOLATILE MEMORY DEVICE

RELATED APPLICATIONS

This application claims priority to U.S. Provisional Application Ser. No. 62/593,066, filed Nov. 30, 2017, which is herein incorporated by reference.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

Super-flash technology has enabled designers to create cost effective and high performance programmable SOC (system on chip) solutions through the use of split-gate flash memory cells. The aggressive scaling of the third generation embedded super-flash (ESF3) memory enables designing flash memories with very high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
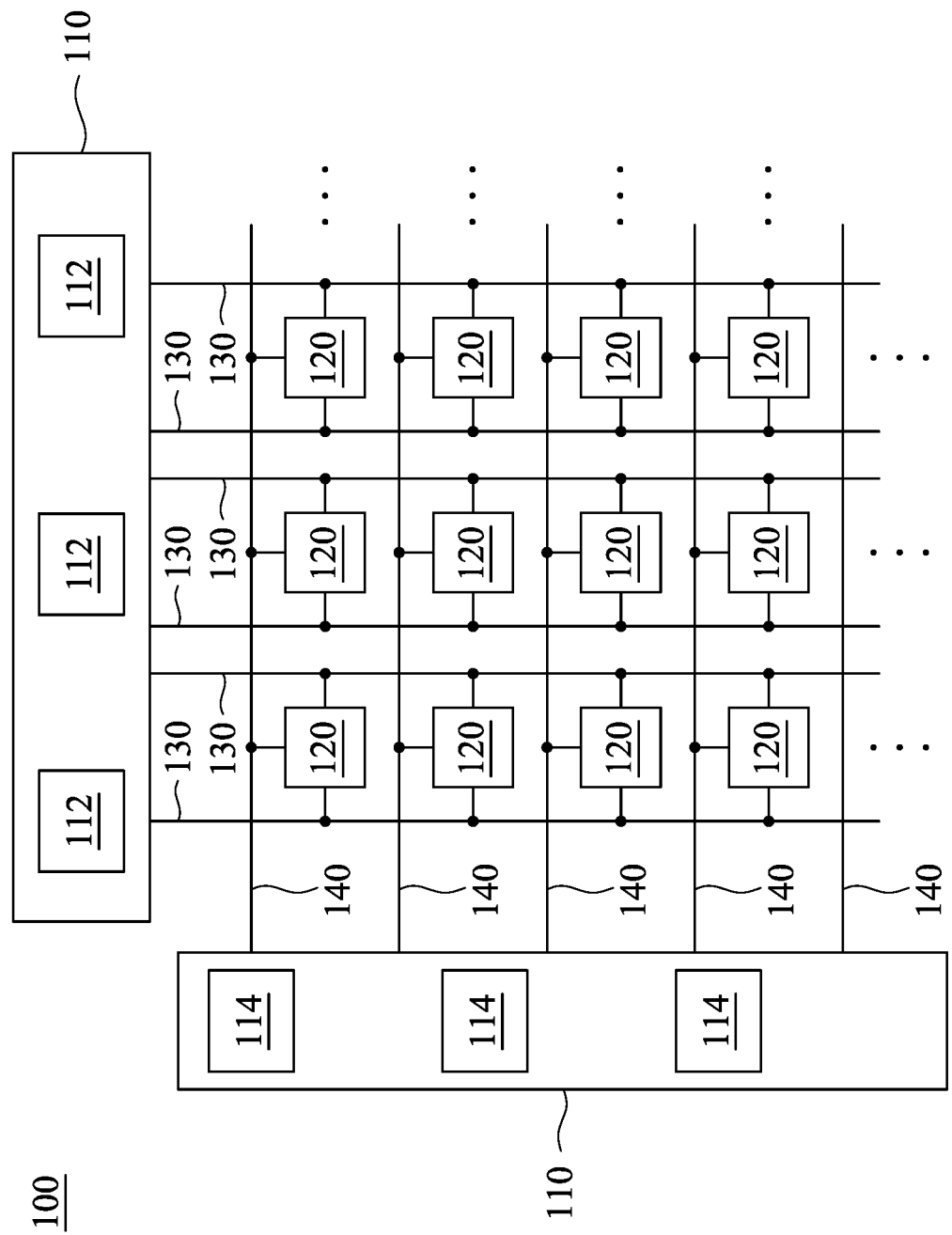
FIG. 1 is a schematic diagram showing a structure of a memory device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical operation for manufacturing a 1.5 T ESF3 memory, the 1.5 T ESF3 memory is formed to have two sub cells each having a floating gate for charge trapping. However, a gate structure including the floating gate and a corresponding control gate has a higher stack topology, such that it is more complicated to integrate the operation of the 1.5 T ESF3 memory and a logic operation due to topology problems. For example, logic devices (such as transistor devices) formed for the floating gates may have a height lower than the height of the gate structure. When a polish operation (such as a chemical mechanical polish (CMP) process) is conducted, the logic devices and/or the gate structure may be damaged by the polish operation due to the height difference between the logic devices and the gate structure. To avoid the damages caused by the polish operation, additional processes and masks are used to increase the heights of the logic devices. However, costs are increased because of the additional processes and masks.

Embodiments of the present disclosure are directed to a memory device and a method for controlling the memory device, in which each floating gate of a floating gate memory cell includes a recess channel, and the floating gate memory cell is programmed using a common source coupling source side injection (SSI) programming method, such that control gates are omitted, thereby lowering a structure topology of the floating gate memory cell. Thus, it is much easier to integrate an operation of the floating gate memory cell and a logic process. Further, the recess channels of the floating gates enhance a coupling ratio of a common source to a floating gate structure and increase an effective channel length, thus decreasing a short channel effect. Furthermore, in the method for controlling the memory device, operations for programming a memory unit of the memory device apply a high voltage on a common source of the memory unit and apply a low voltage on an erase gate of the memory unit, thereby programming the memory unit of the memory device.

FIG. 1 is a schematic diagram showing a structure of a memory device 100 in accordance with various embodiments. The memory device 100 includes plural control circuits 110 and plural memory units 120. The control circuits 110 are electrically connected to the memory units 120 to control the memory units 120. In some embodiments, the control circuits 110 are configured to program and/or erase at least one of the memory units 120. For example, the control circuits 110 may include bit line drivers 112 and word line drivers 114. The bit line drivers 112 and the word line drivers 114 are electrically connected to bit lines 130 and word lines 140 to transmit signals to the memory units 120, thereby controlling the memory units 120.

Figure 2:
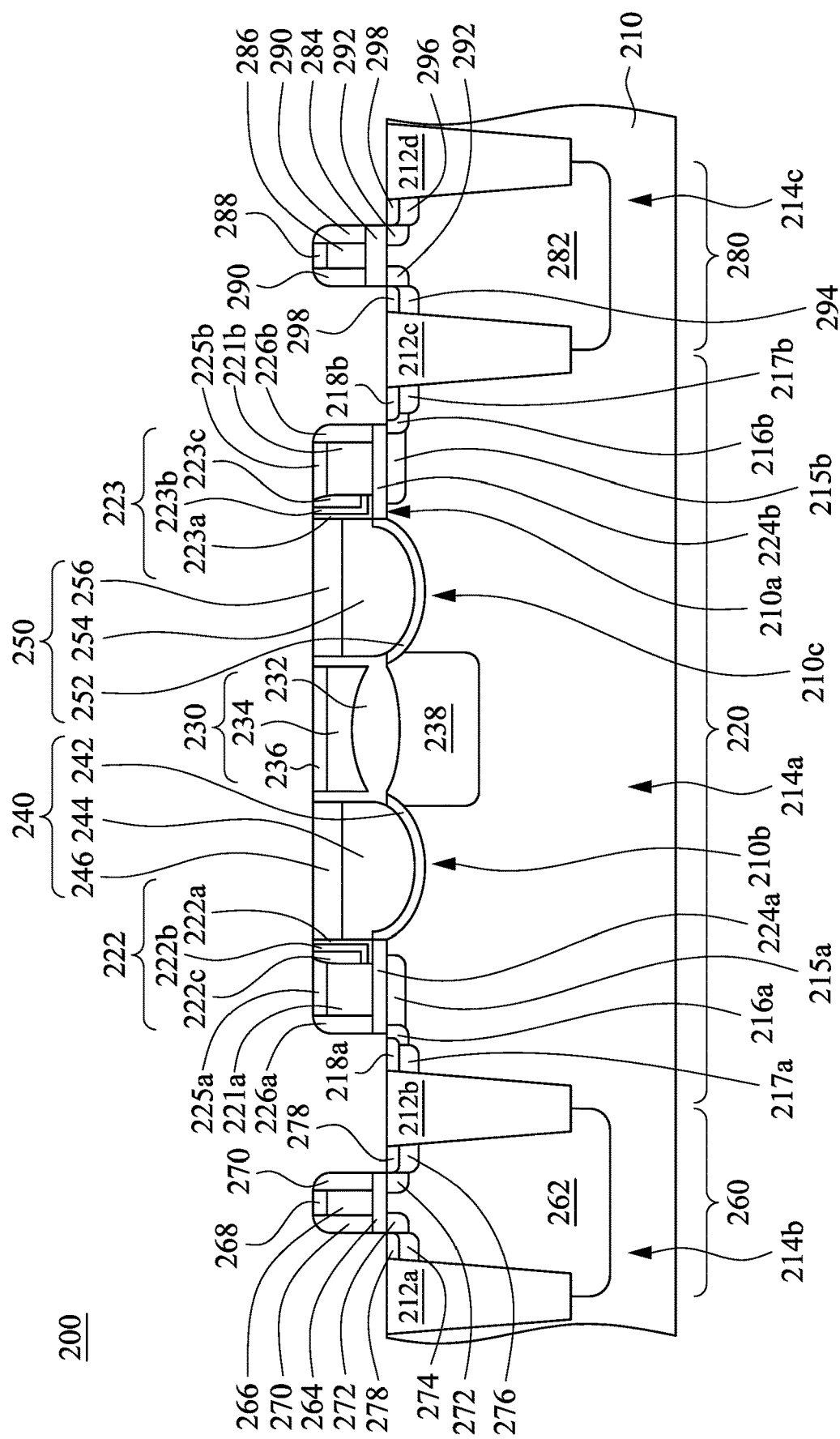
FIG. 2 is a schematic cross-sectional view of a memory unit in accordance with various embodiments of the present disclosure.

FIG. 2 is a schematic cross-sectional view of a memory unit 200 in accordance with various embodiments. In some embodiments, the memory unit 200 is a non-volatile memory unit and adapted for the memory unit 120 shown in FIG. 1. In some examples, the memory unit 200 includes a substrate 210, various isolation structures 212a, 212b, 212c and 212d, a floating gate memory cell 220, a first transistor device 260, and a second transistor device 280. The substrate 210 may be a semiconductor substrate. The substrate 210 may be composed of a single-crystalline semiconductor material or a compound semiconductor material. For example, silicon or germanium may be used as a material forming the substrate 210. In certain examples, the substrate 210 may be a silicon on insulator (SOI) substrate. The substrate 210 has a surface 212. The substrate 210 includes at least two recesses 210b and 210c, such that bottoms of the recesses 210b and 210c are lower than the surface 210a of the substrate 210.

The isolation structures 212a, 212b, 212c and 212d are disposed in the substrate 210 to at least define a first region 214a, a second region 214b, and a third region 214c on the substrate 210. The first region 214a is located between the isolation structures 212b and 212c, the second region 214b is located between the isolation structures 212a and 212b, and the third region 214c is located between the isolation structures 212c and 212d. The isolation structures 212a, 212b, 212c and 212d may be shallow trench isolation (STI) structures. For example, the isolation structures 212a, 212b, 212c and 212d may be formed from silicon oxide.

The floating gate memory cell 220 is disposed in the first region 214a of the substrate 210. In some examples, the floating gate memory cell 220 includes an erase gate structure 230, a first floating gate structure 240, a second floating gate structure 250, a first select gate 221a, a second select gate 221b, a common source 238, a first spacer 222, and a second spacer 223, in which the first select gate 221a and the second select gate 221b are electrically connected to two corresponding word line.

The first floating gate structure 240 is disposed in the recess 210b of the substrate 210. In some examples, the first floating gate structure 240 includes a gate dielectric layer 242, a floating gate 244, and a mask layer 246. The gate dielectric layer 242 covers a surface of the recess 210b. For example, the gate dielectric layer 242 may conformally cover the surface of the recess 210b. The gate dielectric layer 242 may be formed from silicon oxide. The floating gate 244 is disposed on the gate dielectric layer 242 in the recess 210b, such that the gate dielectric layer 242 is disposed between the substrate 210 and the floating gate 244. In some exemplary examples, a bottom of the floating gate 244 is lower than the surface 210a of the substrate 210. For example, the floating gate 244 may be formed from polysilicon. The mask layer 246 is disposed on the floating gate 244. For example, the mask layer 246 may be formed from silicon oxide.

The second floating gate structure 250 is disposed in the recess 210c of the substrate 210. In some examples, the second floating gate structure 250 includes a gate dielectric layer 252, a floating gate 254, and a mask layer 256. The gate dielectric layer 252 covers a surface of the recess 210c. For example, the gate dielectric layer 252 may conformally cover the surface of the recess 210c. The gate dielectric layer 252 may be formed from silicon oxide. The floating gate 254 is disposed on the gate dielectric layer 252 in the recess 210c, such that the gate dielectric layer 252 is disposed between the substrate 210 and the floating gate 254. In some exemplary examples, a bottom of the floating gate 254 is lower than the surface 210a of the substrate 210. For example, the floating gate 254 may be formed from polysilicon. The mask layer 256 is disposed on the floating gate 254. For example, the mask layer 256 may be formed from silicon oxide.

The common source 238 is disposed in the substrate 210 and electrically connected to at least one of the control circuits 110. The common source 238 is located between the first floating gate structure 240 and the second floating gate structure 250. The common source 238 includes dopants, such as boron and phosphorous.

The erase gate structure 230 is disposed on the surface 210a of the substrate 210 and electrically connected to at least one of the control circuits. The erase gate structure 230 is located between the first floating gate structure 240 and the second floating gate structure 250, such that the first floating gate structure 240 and the second floating gate structure 250 are located at two opposite sides of the erase gate structure 230. The erase gate structure 230 includes an erase tunnel dielectric layer 232, an erase gate 234, and a silicide layer 236. The erase gate 234 is disposed over the common source 238. For example, the erase gate 234 may be formed from polysilicon. The silicide layer 236 is disposed on the erase gate 234. The erase gate 234 and the silicide layer 236 are located between the gates 244 and 254. The erase tunnel dielectric layer 232 is disposed on the common source 238, in which the erase tunnel dielectric layer 232 is located between the common source 238 and the erase gate 234, between the first floating gate structure 240 and the erase gate 234, and between the second floating gate structure 250 and the erase gate 234. Thus, the erase gate 234 and the silicide layer 236 are separated from the common source 238 and the gates 244 and 254 by the erase tunnel dielectric layer 232. For example, the erase tunnel dielectric layer 232 may be form from silicon oxide.

In some examples, the floating gate memory cell 220 may further include dielectric layers 224a and 224b. The dielectric layer 224a is disposed on the surface 210a of the substrate 210 and is adjacent to the gate dielectric layer 242. The dielectric layer 224b is disposed on the surface 210a of the substrate 210 and is adjacent to the gate dielectric layer 252. In some exemplary examples, the dielectric layers 224a and 224b are formed from silicon oxide.

Referring to FIG. 2 again, the first spacer 222 is disposed on a portion of the dielectric layer 224a and abuts a sidewall of the first floating gate structure 240. In some examples, the first spacer 222 includes dielectric layers 222a, 222b, and 222c stacked on the dielectric layer 224a and the sidewall of the first floating gate structure 240 in sequence. The dielectric layer 222a may be formed from silicon oxide, the dielectric layer 222b may be formed from silicon nitride, and the dielectric layer 222c may be formed from silicon oxide, such that the first spacer 222 may include an oxide-nitride-oxide (ONO) structure.

The second spacer 223 is disposed on a portion of the dielectric layer 224b and abuts a sidewall of the second floating gate structure 250. In some examples, the second spacer 223 includes dielectric layers 223a, 223b, and 223c stacked on the dielectric layer 224b and the sidewall of the second floating gate structure 250 in sequence. Similarly the dielectric layer 223a may be formed from silicon oxide, the dielectric layer 223b may be formed from silicon nitride, and the dielectric layer 223c may be formed from silicon oxide, such that the second spacer 223 may include an oxide-nitride-oxide structure.

The first select gate 221a is disposed on another portion of the dielectric layer 224a over the surface 210a of the substrate 210 and is adjacent to the first spacer 222, such that the first spacer 222 is located between the first floating gate structure 240 and the first select gate 221a to separate the gate 244 from the first select gate 221a. The first select gate 221a and the erase gate structure 230 are located at opposite sides of the first floating gate structure 240. For example, the first select gate 221a may be formed from polysilicon. In some exemplary examples, the floating gate memory cell 220 further includes a silicide layer 225a and a spacer 226a. The silicide layer 225a is disposed on the first select gate 221a. The first spacer 222 separates the gate 244 from the silicide layer 225a. The spacer 226a is disposed on the other portion of the dielectric layer 224a adjacent to the first select gate 221a and the silicide layer 225a. For example, the spacer 226a may be formed from silicon nitride or silicon oxynitride.

The second select gate 221b is disposed on another portion of the dielectric layer 224b over the surface 210a of the substrate 210 and is adjacent to the second spacer 223, such that the second spacer 223 is located between the second floating gate structure 250 and the second select gate 221b to separate the gate 254 from the second select gate 221b. The second select gate 221b and the erase gate structure 230 are located at opposite sides of the second floating gate structure 250. For example, the second select gate 221b may be formed from polysilicon. In some exemplary examples, the floating gate memory cell 220 further includes a silicide layer 225b and a spacer 226b. The silicide layer 225b is disposed on the second select gate 221b. The second spacer 223 separates the gate 254 from the silicide layer 225b. The spacer 226b is disposed the other portion of the dielectric layer 224b adjacent to the second select gate 221b and the silicide layer 225b. For example, the spacer 226b may be formed from silicon nitride or silicon oxynitride.

Referring to FIG. 2 again, in some examples, the floating gate memory cell 220 may include implantation regions 215a, 215b, 217a, and 217b, lightly doped drains (LDD) 216a and 216b, and silicide layers 218a and 218b. The implantation regions 215a, 215b, 217a, and 217b, and the lightly doped drains 216a, 216b are disposed in the substrate 210 adjacent to the surface 210a. The implantation regions 215a and 215b are respectively under the dielectric layers 224a and 224b. The lightly doped drains 216a and 216b are respectively disposed in the implantation regions 215a and 215b. The implantation regions 217a and 217b are respectively disposed in the lightly doped drains 216a and 216b. The implantation regions 217a and 217b are considered as drains of the floating gate memory cell 220. The silicide layer 218a is disposed on the lightly doped drain 216a and the implantation region 217a. The silicide layer 218b is disposed on the lightly doped drain 216b and the implantation region 217b.

The first transistor device 260 is disposed in the second region 214b of the substrate 210. For example, the first transistor device 260 may be a low voltage device. In some examples, the first transistor device 260 includes a well 262, a gate dielectric layer 264, a gate 266, a silicide layer 268, two spacers 270, two lightly-doped drains 272, a source 274, and a drain 276. The well 262 is disposed in the substrate 210. The well 262 includes dopants, such as boron and phosphorous. The gate dielectric layer 264 is disposed on the well 262. The gate dielectric layer 264 may be formed from silicon oxide. The gate 266 is disposed on a portion of the gate dielectric layer 264. The gate 266 may be formed from polysilicon. The silicide layer 268 is disposed on the gate 266. The spacers 270 are disposed on the other portions of the gate dielectric layer 264, and the spacers 270 are disposed at opposite sides of the gate 266 and the silicide layer 268, such that the spacers 270 sandwich the gate 266 and the silicide layer 268.

The lightly-doped drains 272 are disposed in the well 262 adjacent to the opposite sides of the gate 268. The source 274 and the drain 276 are respectively disposed in the lightly-doped drains 272 adjacent to the opposite sides of the gate 268. In some exemplary examples, the first transistor device 260 further includes two silicide layers 278, in which the silicide layers 278 are respectively disposed on the lightly doped drains 272, and are respectively located on the source 274 and the drain 276.

The second transistor device 280 is disposed in the third region 214c of the substrate 210. For example, the second transistor device 280 may be a high voltage device. In some examples, the second transistor device 280 includes a well 282, a gate dielectric layer 284, a gate 286, a silicide layer 288, two spacers 290, two lightly-doped drains 292, a source 294, and a drain 296. The well 282 is disposed in the substrate 210. The well 282 includes dopants, such as boron and phosphorous. The gate dielectric layer 284 is disposed on the well 282. In some exemplary examples, the gate dielectric layer 264 of the first transistor device 260 is thinner than the gate dielectric layer 284 of the second transistor device 280. The gate dielectric layer 284 may be formed from silicon oxide. The gate 286 is disposed on a portion of the gate dielectric layer 284. The gate 286 may be formed from polysilicon. The silicide layer 288 is disposed on the gate 286. The spacers 290 are disposed on the other portions of the gate dielectric layer 284, and the spacers 290 are disposed at opposite sides of the gate 286 and the silicide layer 288, such that the spacers 290 sandwich the gate 286 and the silicide layer 288.

The lightly-doped drains 292 are disposed in the well 282 adjacent to the opposite sides of the gate 288. The source 294 and the drain 296 are respectively disposed in the lightly-doped drains 292 adjacent to the opposite sides of the gate 288. In some exemplary examples, the first transistor device 280 further includes two silicide layers 298, in which the silicide layers 298 are respectively disposed on the lightly doped drains 292, and are respectively located on the source 294 and the drain 296.

In the floating gate memory cell 220, the gate 244 of the first floating gate structure 240 and the gate 254 of the second floating gate structure 250 are disposed on the recesses 210b and 210c of the substrate 210, such that each of the first floating gate structure 240 and the second floating gate structure 250 has a recess channel, and the first floating gate structure 240 and the second floating gate structure 250 contact sidewalls of the common source 238. Because the first floating gate structure 240 and the second floating gate structure 250 contact sidewalls of the common source 238, signals applied to the common source 238 can be effectively coupled to the first floating gate structure 240 and the second floating gate structure 250, such that a coupling ratio of the common source 238 to the floating gate structure 240/250 is increased. In some embodiments, in a memory, a floating gate structure is formed on a flat surface of a substrate in which a common source is formed. In this case, the common source has a small area contacting the floating gate structure, such that a coupling ratio of the common source to the floating gate structure is small. Alternatively stated, the coupling ratio of the common source to the floating gate structure corresponds to the area of the common source contacting the floating gate structure. In the above embodiments, the floating gate structure 240/250 is formed on a recess of the substrate 210. Therefore, the common source 238 has a bigger area contacting the floating gate structure 240/250, compared to some approaches, and the coupling ratio of the common source 238 to the floating gate structure 240/250 is increased accordingly.

Figure 3:
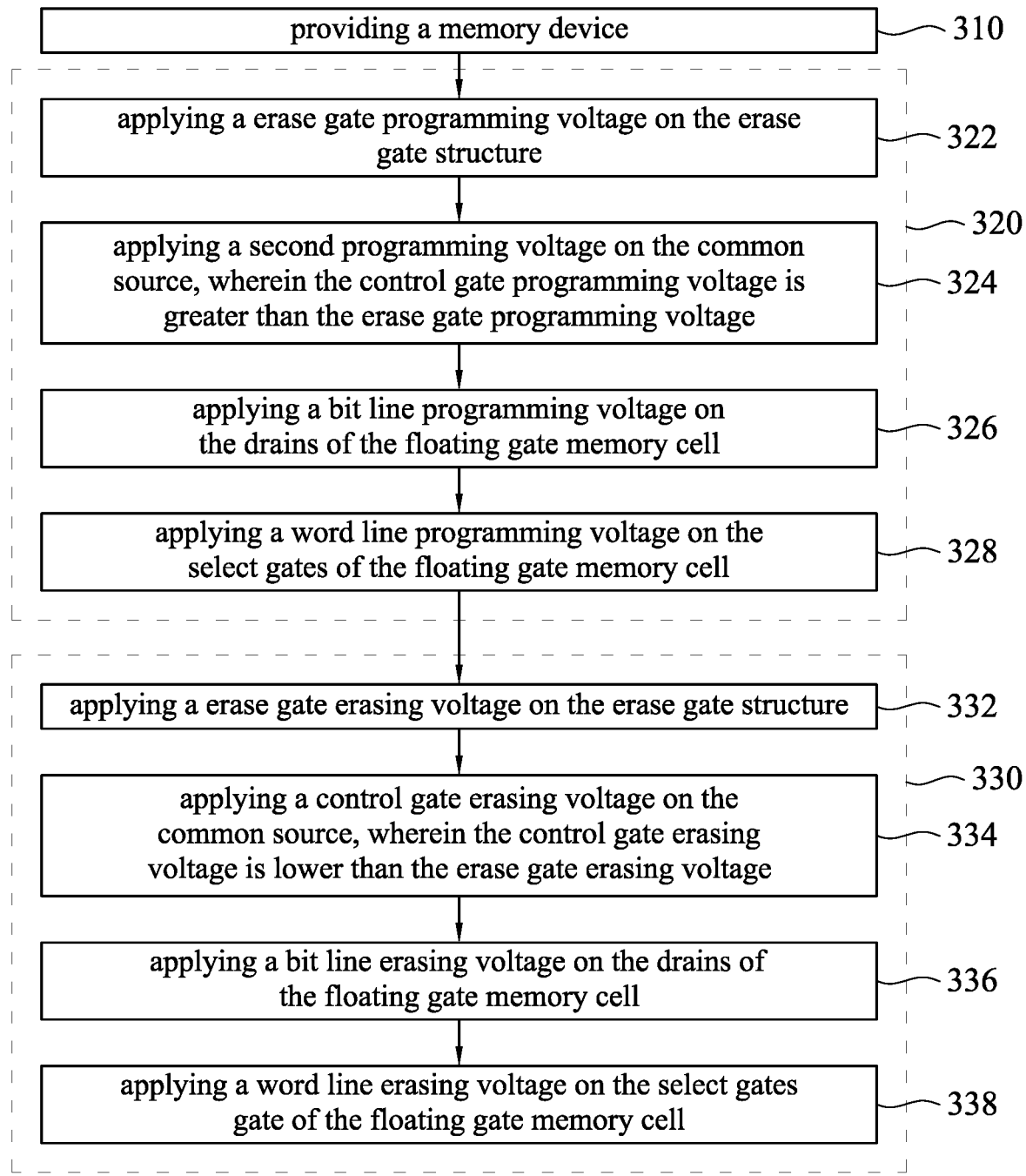
FIG. 3 is a flow chart of a method for controlling a memory device in accordance with various embodiments of the present disclosure.

Referring to FIG. 3, FIG. 3 is a flow chart of a method 300 for controlling a memory device in accordance with various embodiments. In the method 300, operation 310 is conducted to provide a memory device, such as the memory device 100 shown in FIG. 1. Then, a programming stage 320 is performed to program at least one of the memory units 120. In some embodiments, a common source coupling source side injection programming method is used to program the at least one memory unit 120. In some embodiments, the memory unit 200 is applied for each of the memory units 120 of the memory device 100. In the following descriptions, the memory unit 200 is taken as an example for illustration of the method 300. In the programming stage 320, operations 322 to 328 are performed to apply voltage signals on the memory unit 200 by using the control circuits 110, as show in FIG. 4A.

At operation 322, an erase gate programming voltage $V_{PEG}$ is applied on the erase gate structure 230. In some embodiments, the erase gate programming voltage $V_{PEG}$ is applied on the silicide layer 236 of the erase gate structure 230. At operation 324, a control gate programming voltage $V_{PCG}$ is applied on the common source 238. The control gate programming voltage $V_{PCG}$ is greater than the erase gate programming voltage $V_{PEG}$. At operation 326, a bit line programming voltage $V_{PBL}$ is applied on the drains 217a and 217b of the floating gate memory cell 220. In some embodiments, the silicide layers 218a and 218b are electrically connected to corresponding bit lines 130 to enable the bit line programming voltage $V_{PBL}$ to be applied on the drains 217a and 217b through the silicide layers 218a and 218b. At operation 328, a word line programming voltage $V_{PWL}$ is applied on the select gates 221a and 221b of the floating gate memory cell 220. In some embodiments, the silicide layers 225a and 225b are electrically connected to two corresponding word lines 140 to enable the word line programming voltage $V_{PWL}$ to be applied on the select gates 221a and 221b through the silicide layers 225a and 225b.

In some embodiments, the erase gate programming voltage $V_{PEG}$ is ranged from 0 volt to 8 volts, the control gate programming voltage $V_{PCG}$ is ranged from substantially 8 volts to 18 volts, the bit line programming voltage $V_{PBL}$ is ranged from 0 volts to 2.5 volts, and the word line programming voltage $V_{PWL}$ is ranged from 0.9 volts to 3.3 volts. In this case, the erase gate programming voltage $V_{PEG}$ is 0 volt, the control gate programming voltage $V_{PCG}$ is substantially 10 volts, the bit line programming voltage $V_{PBL}$ is substantially 1 volt, and the word line programming voltage $V_{PWL}$ is substantially 1.1 volts. Further, the erase gate programming voltage $V_{PEG}$ is designed to be smaller than the control gate programming voltage $V_{PCG}$.

Figure 4A:
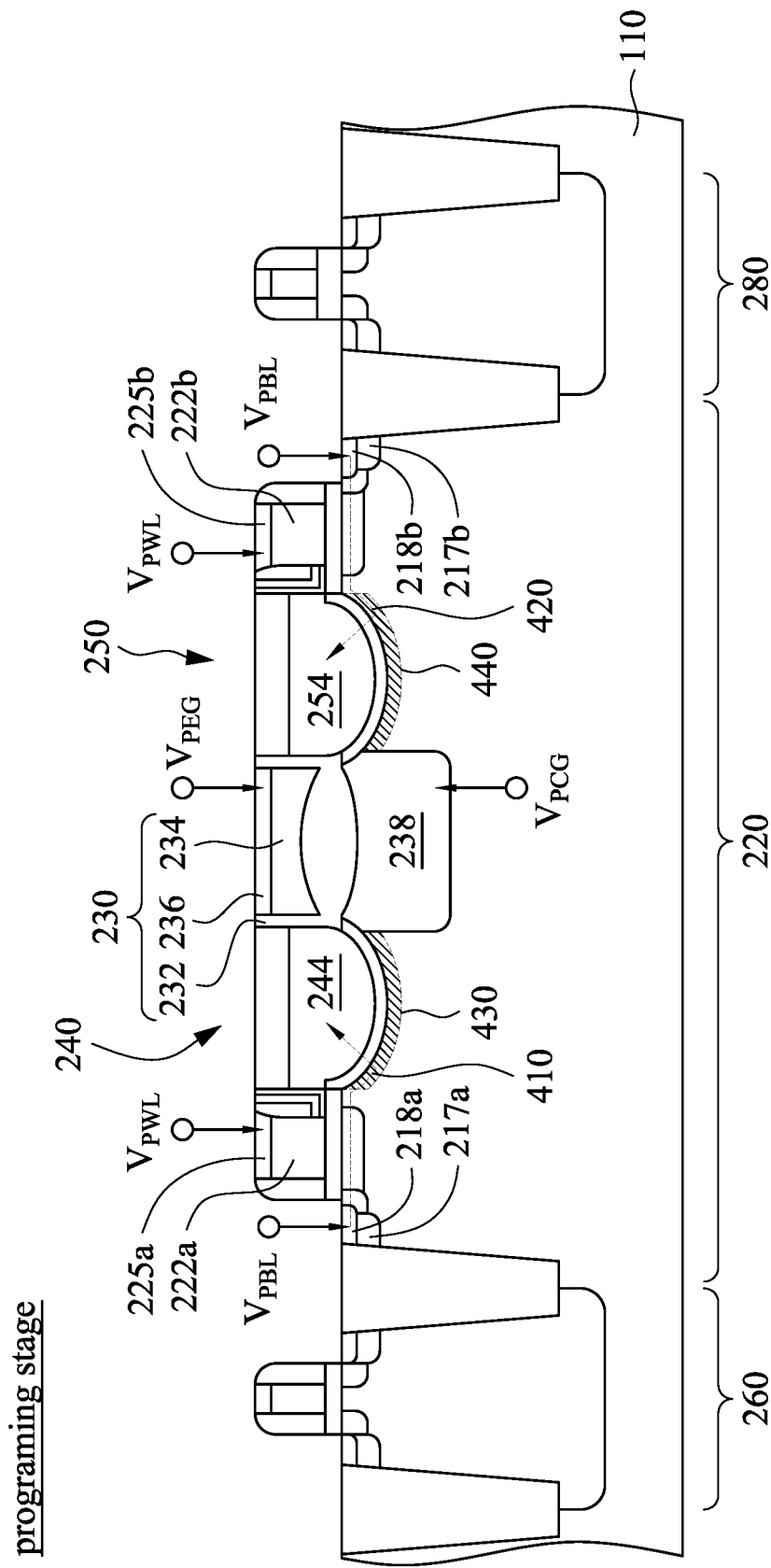
FIG. 4A and FIG. 4B are schematic diagrams showing voltage signals applied on the memory unit at a programing stage and an erasing stage in accordance with various embodiments of the present disclosure.

At the programming stage 320, electrons from drains 217a and 217b are attracted to the first floating gate structure 240 and the second floating gate structure 250, and then trapped in the gate 244 and the gate 254. For example, as shown in FIG. 4A, the electrons may be attracted along paths 410 and 420. Because the first floating gate structure 240 and the second floating gate structure 250 are disposed on the recesses of the substrate 210, recessed channels 430 and 440 can be formed under the first floating gate structures 240 and 250, thereby increasing the effective channel length of the floating gate memory cell 220. In some embodiments, the recessed channels 430 and 440 are induced to have a curved shape for increasing effective channel length, because the bottom surfaces of the gates 244 and 254 are curved.

In some embodiments, the common source coupling source side injection programming method is performed to apply a relatively high voltage on the common source 238 and a relatively low voltage on the erase gate structure 230, in order to enable the electrons from the drains 217a/217b to be attracted to the common source 238 along the recessed channel 430/440, and to enable the electrons in the recessed channel 430/440 to be trapped into the gate 244/254. With the electrons being stored in the gate 244/254, the programming operation is then completed.

Figure 4B:
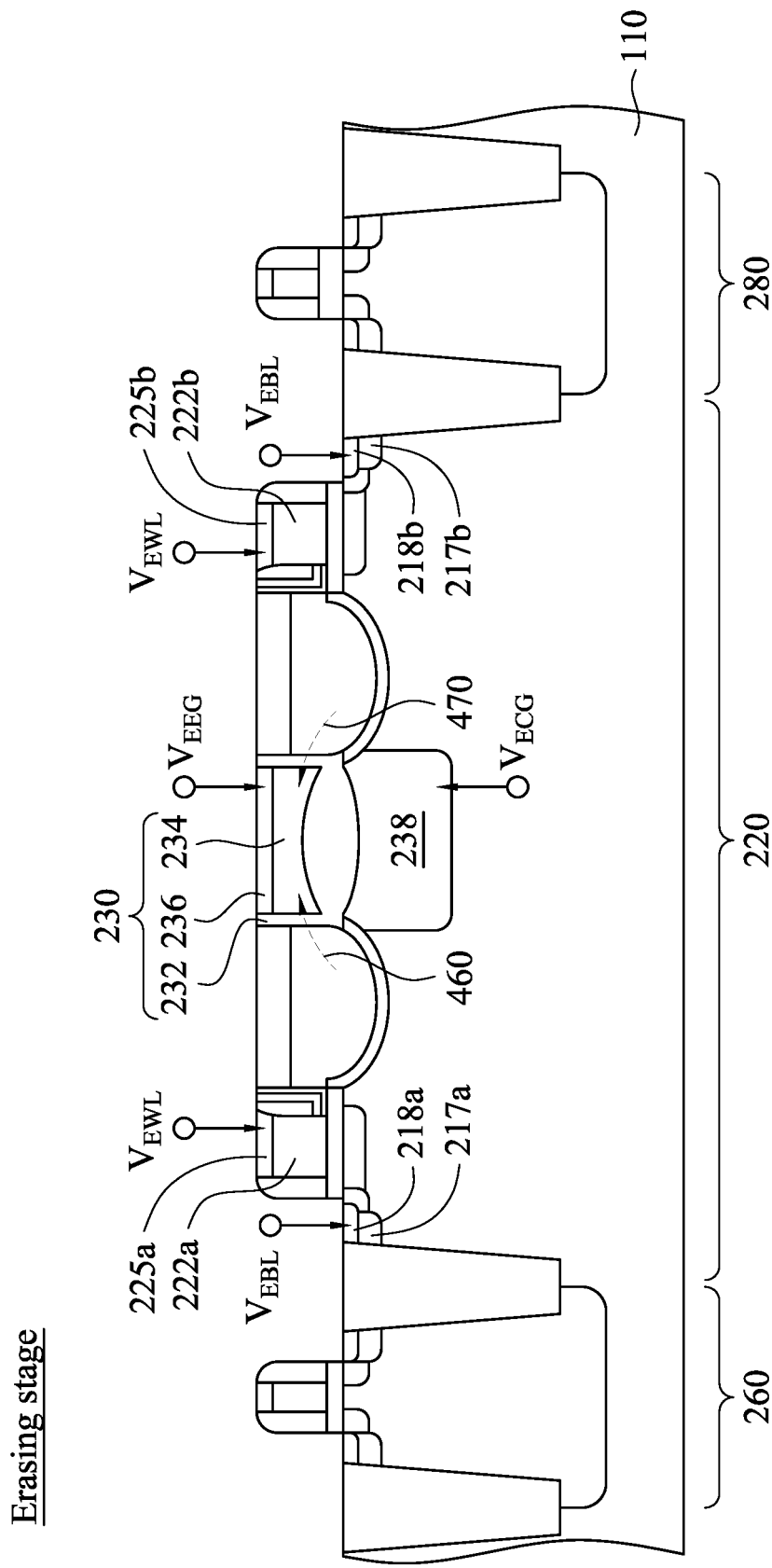

In some embodiments, an erasing stage 330 is performed to erase the at least one memory unit 120 after the programming stage 320. In some embodiments, a FN tunneling erasing method is used to erase the at least one memory unit 120. In the erasing stage 330, operations 332 to 338 are performed to apply voltage signals on the memory unit 200 by using the control circuits 110, as show in FIG. 4B. In some embodiments, the FN tunneling is achieved by raising the voltage level on the erase gate structure 230 to a significantly high value to enable the electrons trapped in the floating gates 244 and 254 to tunnel through the dielectric layer 232 to the erase gate structure 230. Therefore, the electrons trapped in the floating gates 244 and 254 escape from the floating gates 244 and 254 to the erase gate structure 230.

In the above embodiments, a first sub cell 220a including the first floating gate structure 240 and a second sub cell 220b including the second floating gate structure 250 are programed simultaneously, but embodiments of the present disclosure are not limited thereto. In some embodiments, the first sub cell 220a and the second sub cell 220b can be programmed individually.

At operation 332, an erase gate programming voltage $V_{EEG}$ is applied on the erase gate structure 230. In some embodiments, the erase gate programming voltage $V_{EEG}$ is applied on the silicide layer 236 of the erase gate structure 230. At operation 334, a control gate erasing voltage $V_{ECG}$ is applied on the common source 238. The control gate erasing voltage $V_{ECG}$ is lower than the erase gate programming voltage $V_{EEG}$. At operation 336, a bit line erasing voltage $V_{EBL}$ is applied on the drains 217a and 217b of the floating gate memory cell 220. At operation 338, a word line erasing voltage $V_{EWL}$ is applied on the select gates 221a and 221b of the floating gate memory cell 220.

In some embodiments, the erase gate programming voltage $V_{EEG}$ is ranged from 8 volts to 15 volts, the control gate erasing voltage $V_{ECG}$ is ranged from −1 volts to 1 volts, the bit line erasing voltage $V_{EBL}$ is ranged from −1 volts to 1 volts, and the word line erasing voltage $V_{EWL}$ is ranged from −1 volts to 1 volts. In this case, the erase gate programming voltage $V_{EEG}$ is 12 volts, the control gate erasing voltage $V_{ECG}$ is substantially 0 volt, the bit line erasing voltage $V_{EBL}$ is substantially 0 volt, and the word line erasing voltage $V_{EWL}$ is substantially 0 volt. At the erasing stage 330, electrons trapped into the gates 244 and 254 escape from the gates 244 and 254 to the erase gate 234 along paths 460 and 470, thereby erasing the memory unit 200.

In some approaches, the common source coupling source side injection programming method is performed to apply a high voltage on a control gate formed on a floating gate for achieving a programing operation, and the floating gate is formed on a flat surface of a substrate. A gate structure including the control gate and the floating gate has a higher stack topology. Compared to the aforementioned approaches, the control gate is omitted in the above embodiments of the present application, and the floating gate structure 240/250 as discussed above protrudes from a recess of the substrate 110, such that the floating gate memory cell 220 has a lower stack topology. Further, the common source coupling source side injection programming method used in the above embodiments applies a relatively high voltage on the common source 238 and a relatively low voltage on the erase gate structure 230, such that the channel 430/440 having a long effective channel length is obtained for achieving the programing operation.

In some embodiments, the control gate programming voltage $V_{PCG}$ ranging from substantially 8 volts to substantially 18 volts is applied on the common source 238, and the erase gate programming voltage $V_{PEG}$ ranging from substantially 0 volt to substantially 8 volts is applied on the erase gate structure 230, thereby achieving the programing operation.

As discussed above, the floating gate memory cell 220 has a lower stack topology, and thus additional processes and masks used to increase heights of logic devices, such as the transistor device 260/280, are saved. Therefore, it is easier to integrate the fabrication process of the floating gate memory cell 220 with the fabrication process of the logic devices.

Figure 5:
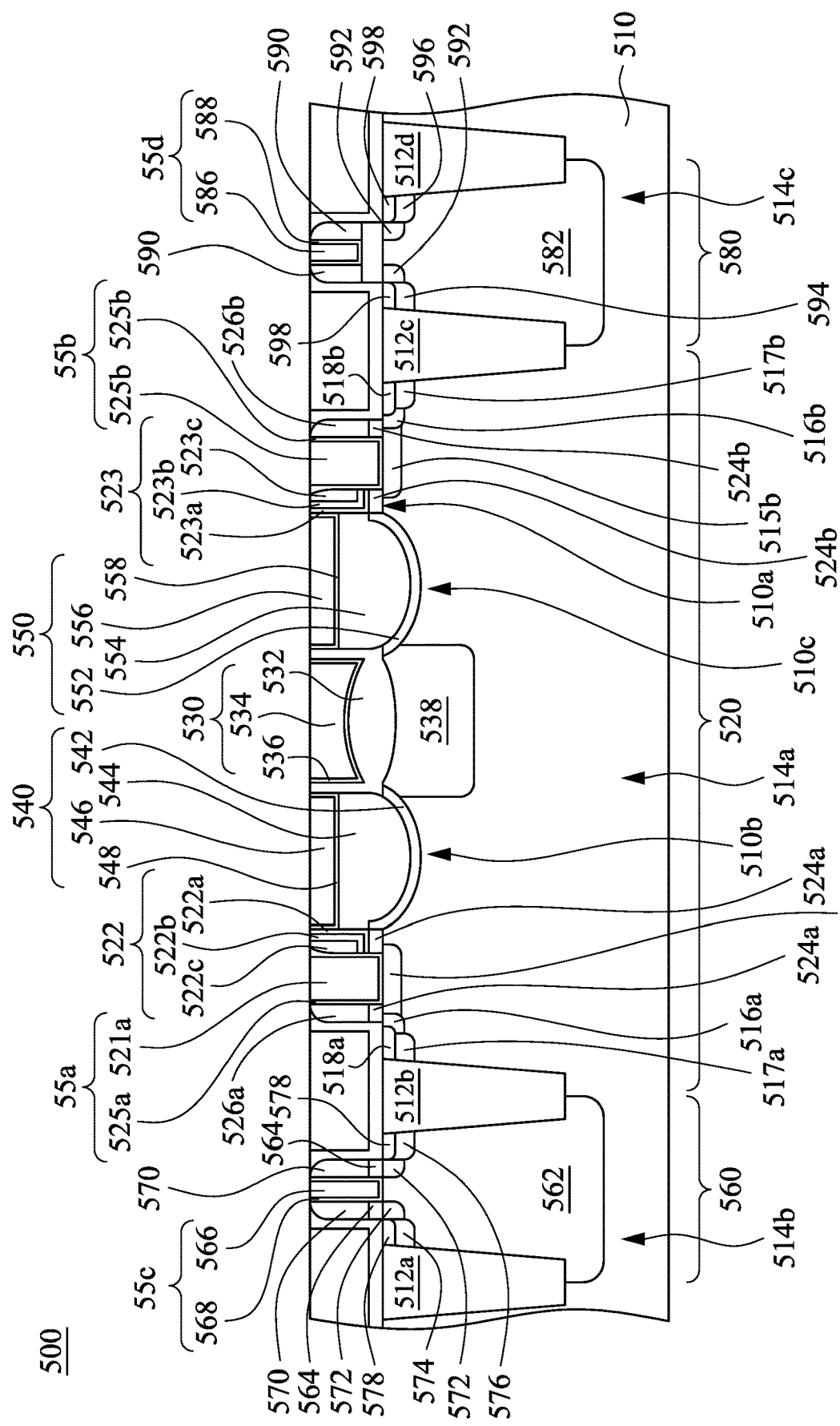
FIG. 5 is a schematic cross-sectional view of a memory unit in accordance with various embodiments of the present disclosure.

FIG. 5 is a schematic cross-sectional view of a memory unit 500 in accordance with various embodiments of the present disclosure. In some embodiments, the memory unit 500 is a non-volatile memory unit and adapted for the memory unit 120 shown in FIG. 1. The memory unit 500 includes a substrate 510, various isolation structures 512a, 512b, 512c and 512d, a floating gate memory cell 520, a first transistor device 560, and a second transistor device 580. The substrate 510 may be a semiconductor substrate. The substrate 510 may be composed of a single-crystalline semiconductor material or a compound semiconductor material. For example, silicon or germanium may be used as a material forming the substrate 510. In certain examples, the substrate 510 may be a silicon on insulator (SOI) substrate. The substrate 510 includes at least two recesses 510b and 510c, such that bottoms of the recesses 510b and 510c are lower than the surface 510a of the substrate 510.

The isolation structures 512a, 512b, 512c and 512d are disposed in the substrate 510 to at least define a first region 514a, a second region 514b, and a third region 514c on the substrate 510. The first region 514a is located between the isolation structures 512b and 512c, the second region 514b is located between the isolation structures 512a and 512b, and the third region 514c is located between the isolation structures 512c and 512d. The isolation structures 512a, 512b, 512c and 512d may be shallow trench isolation (STI) structures. For example, the isolation structures 512a, 512b, 512c and 512d may be formed from silicon oxide.

The floating gate memory cell 520 is disposed in the first region 514a of the substrate 510. In some examples, the floating gate memory cell 520 includes an erase gate structure 530, a first floating gate structure 540, a second floating gate structure 550, a first select gate 521a, a first high-k dielectric layer 525a, a second select gate 521b, a second high-k dielectric layer 525b, a common source 538, a spacer 522, and a spacer 523, in which the first select gate 521a and the second select gate 521b are electrically connected to two corresponding word lines. In some embodiment, each of the floating gate memory cell 520 may be electrically connected to two corresponding word lines and two corresponding bit lines.

The first floating gate structure 540 is disposed in the recess 510b of the substrate 510. In some examples, the first floating gate structure 540 includes a gate dielectric layer 542, a floating gate 544, a mask layer 546 and an etch stop layer 548. The gate dielectric layer 542 covers a surface of the recess 510b. For example, the gate dielectric layer 542 may conformally cover the surface of the recess 510b. The gate dielectric layer 542 may be formed from silicon oxide. The floating gate 544 is disposed on the gate dielectric layer 542 in the recess 510b, such that the gate dielectric layer 542 is disposed between the substrate 510 and the floating gate 544. In some exemplary examples, a bottom of the floating gate 544 is lower than the surface 510a of the substrate 510. For example, the floating gate 544 may be formed from polysilicon. The mask layer 546 and the etch stop layer 548 are disposed on the floating gate 544. For example, the mask layer 546 may be formed from silicon oxide, and the etch stop layer 548 may be formed from silicon nitride, silicon oxynitride, silicon carbide, silicon oxide, or a combinations thereof.

The second floating gate structure 550 is disposed in the recess 510c of the substrate 510. In some examples, the second floating gate structure 550 includes a gate dielectric layer 552, a floating gate 554, a mask layer 556, and an etch stop layer 558. The gate dielectric layer 552 covers a surface of the recess 510c. For example, the gate dielectric layer 552 may conformally cover the surface of the recess 510c. The gate dielectric layer 552 may be formed from silicon oxide. The floating gate 554 is disposed on the gate dielectric layer 552 in the recess 510c, such that the gate dielectric layer 552 is disposed between the substrate 510 and the floating gate 554. In some exemplary examples, a bottom of the floating gate 554 is lower than the surface 510a of the substrate 510. For example, the floating gate 554 may be formed from polysilicon. The mask layer 556 and the etch stop layer 558 are disposed on the floating gate 554. For example, the mask layer 556 may be formed from silicon oxide, and the etch stop layer 558 may be a contact etch stop layer (CESL) formed from silicon nitride, silicon oxynitride, silicon carbide, silicon oxide, or a combinations thereof.

The common source 538 is disposed in the substrate 510 and electrically connected to at least one of the control circuits 110. The common source 538 is located between the first floating gate structure 540 and the second floating gate structure 550. The common source 538 includes dopants, such as boron and phosphorous.

The erase gate structure 530 is disposed on the surface 510a of the substrate 510 and electrically connected to at least one of the control circuits 110. The erase gate structure 530 is located between the first floating gate structure 540 and the second floating gate structure 550, such that the first floating gate structure 540 and the second floating gate structure 550 are located at two opposite sides of the erase gate structure 530. The erase gate structure 530 includes an erase tunnel dielectric layer 532, an erase gate 534, and a gate dielectric layer 536. The erase gate 534 and the gate dielectric layer 536 are disposed over the common source 538. The erase gate 534 and the gate dielectric layer 536 are located between the floating gates 544 and 554. The erase tunnel dielectric layer 532 is disposed on the common source 538, in which the erase tunnel dielectric layer 532 is located between the common source 538 and the gate dielectric layer 536, between the first floating gate structure 540 and the gate dielectric layer 536, and between the second floating gate structure 550 and the gate dielectric layer 536. Thus, the erase gate 534 and the gate dielectric layer 536 are separated from the common source 538 and the floating gates 544 and 554 by the erase tunnel dielectric layer 532. For example, the erase tunnel dielectric layer 532 may be form from silicon oxide. In some examples, the erase gate 534 is formed from metal and the gate dielectric layer 536 is formed from a high-k material layer, such that the erase gate 534 and the gate dielectric layer 536 form a high-k metal gate structure. For example, the erase gate 534 may be formed from Ti, TiN, TaN, Ta, TaC, TaSiN, W, WN, MoN, MoON and/or other suitable materials, and the gate dielectric layer 536 may be formed from hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials.

In some examples, the floating gate memory cell 520 may further include dielectric layers 524a and 524b. The dielectric layers 524a are disposed on the surface 510a of the substrate 510 and near the gate dielectric layer 542. The dielectric layers 524b are disposed on the surface 510a of the substrate 510 and near the gate dielectric layer 552. In some exemplary examples, the dielectric layers 524a and 524b are formed from silicon oxide.

Referring to FIG. 5 again, the spacer 522 is disposed on a portion of the dielectric layers 524a and abuts a sidewall of the first floating gate structure 540. In some examples, the spacer 522 includes dielectric layers 522a, 522b, and 522c stacked on the portion of the dielectric layers 524a and the sidewall of the first floating gate structure 540 in sequence. The dielectric layer 522a may be formed from silicon oxide, the dielectric layer 522b may be formed from silicon nitride, and the dielectric layer 522c may be formed from silicon oxide, such that the spacer 522 may include an oxide-nitride-oxide (ONO) structure.

The spacer 523 is disposed on a portion of the dielectric layers 524b and abuts a sidewall of the second floating gate structure 550. In some examples, the spacer 523 includes dielectric layers 523a, 523b, and 523c stacked on the portion of the dielectric layers 524b and the sidewall of the second floating gate structure 550 in sequence. Similarly, the dielectric layer 523a may be formed from silicon oxide, the dielectric layer 523b may be formed from silicon nitride, and the dielectric layer 523c may be formed from silicon oxide, such that the spacer 523 may include an oxide-nitride-oxide structure.

The first select gate 521a and the first high-k dielectric layer 525a form a high-k metal gate structure 55a. For example, the first select gate 521a may be formed from metal including Ti, TiN, TaN, Ta, TaC, TaSiN, W, WN, MoN, MoON and/or other suitable materials, and the first high-k dielectric layer 525a may be formed from high-k material including hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials.

The high-k metal gate structure 55a is disposed between the dielectric layers 524a and is adjacent to the spacer 522, such that the spacer 522 is located between the first floating gate structure 540 and the high-k metal gate structure 55a to separate the floating gate 544 from the high-k metal gate structure 55a. The high-k metal gate structure 55a and the erase gate structure 530 are located at opposite sides of the first floating gate structure 540. The spacer 526a is disposed on the other portion of the dielectric layers 524a, such that the spacer 526a and the spacer 522 are located at opposite sides of the high-k metal gate structure 55a. For example, the spacer 526a may be formed from silicon nitride or silicon oxynitride.

The second select gate 521b and the second high-k dielectric layer 525b form a high-k metal gate structure 55b. For example, the second select gate 521b may be formed from metal including Ti, TiN, TaN, Ta, TaC, TaSiN, W, WN, MoN, MoON and/or other suitable materials, and the second high-k dielectric layer 525b may be formed from high-k material including hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials.

The high-k metal gate structure 55b is disposed between the dielectric layers 524b and is adjacent to the spacer 523, such that the spacer 523 is located between the second floating gate structure 550 and the high-k metal gate structure 55b to separate the floating gate 554 from the high-k metal gate structure 55b. The high-k metal gate structure 55b and the erase gate structure 530 are located at opposite sides of the second floating gate structure 550. The spacer 526b is disposed the other portion of the dielectric layers 524b, such that the spacer 526b and the spacer 523 are located at opposite sides of the high-k metal gate structure 55b For example, the spacer 526b may be formed from silicon nitride or silicon oxynitride.

Referring to FIG. 5 again, in some examples, the floating gate memory cell 520 may include implantation regions 515a, 515b, 517a, and 517b, lightly doped drains (LDD) 516a and 516b, and silicide layers 518a and 518b. The implantation regions 515a, 515b, 517a, and 517b, and the lightly doped drains 516a, 516b are disposed in the substrate 510 adjacent to the surface 510a. The implantation regions 515a and 515b are respectively under the dielectric layers 524a and 524b. The lightly doped drains 516a and 516b are respectively disposed in the implantation regions 515a and 515b. The implantation regions 517a and 517b are respectively disposed in the lightly doped drains 516a and 516b. The implantation regions 517a and 517b are considered as drains of the floating gate memory cell 520. The silicide layer 518a is disposed on the lightly doped drain 516a and the implantation region 517a. The silicide layer 518b is disposed on the lightly doped drain 516b and the implantation region 517b.

The first transistor device 560 is disposed in the second region 514b of the substrate 510. For example, the first transistor device 560 may be a low voltage device. In some examples, the first transistor device 560 includes a well 562, dielectric layers 564, a gate 566, a gate dielectric layer 568, two spacers 570, two lightly-doped drains 572, a source 574, and a drain 576. The well 562 is disposed in the substrate 510. The well 562 includes dopants, such as boron and phosphorous. The dielectric layers 564 are disposed on the well 562. The dielectric layers 564 may be formed from silicon oxide. The gate 566 and the gate dielectric layer 568 form a high-k metal gate structure 55c. For example, the gate 566 may be formed from metal including Ti, TiN, TaN, Ta, TaC, TaSiN, W, WN, MoN, MoON and/or other suitable materials, and the gate dielectric layer 568 may be formed from high-k material including hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. The high-k metal gate structure 55c is disposed between the gate dielectric layers 564. The spacers 570 are disposed on the gate dielectric layers 564, and the spacers 570 are disposed at opposite sides of the high-k metal gate structure 55c, such that the spacers 570 sandwich the high-k metal gate structure 55c.

The lightly-doped drains 572 are disposed in the well 562 adjacent to the opposite sides of the high-k metal gate structure 55c. The source 574 and the drain 576 are respectively disposed in the lightly-doped drains 572 adjacent to the opposite sides of the high-k metal gate structure 55c. In some exemplary examples, the first transistor device 560 further includes two silicide layers 578, in which the silicide layers 578 are respectively disposed on the lightly doped drains 572, and are respectively located on the source 574 and the drain 576.

The second transistor device 580 is disposed in the third region 514c of the substrate 510. For example, the second transistor device 580 may be a high voltage device. In some examples, the second transistor device 580 includes a well 582, a gate dielectric layer 584, a gate 586, a high-k dielectric layer 588, two spacers 590, two lightly-doped drains 592, a source 594, and a drain 596. The well 582 is disposed in the substrate 510. The well 582 includes dopants, such as boron and phosphorous. The gate dielectric layer 584 is disposed on the well 582. In some exemplary examples, each of the dielectric layers 564 of the first transistor device 560 is thinner than the gate dielectric layer 584 of the second transistor device 580. The gate dielectric layer 584 may be formed from silicon oxide. The gate 586 and the gate dielectric layer 588 form a high-k metal gate structure 55d. For example, the gate 586 may be formed from metal including Ti, TiN, TaN, Ta, TaC, TaSiN, W, WN, MoN, MoON and/or other suitable materials, and the gate dielectric layer 588 may be formed from high-k material including hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. The high-k metal gate structure 55d is disposed on a portion of the gate dielectric layer 584. The spacers 590 are disposed on the other portions of the gate dielectric layer 584, and the spacers 590 are disposed at opposite sides of the high-k metal gate structure 55d, such that the spacers 590 sandwich high-k metal gate structure 55d.

The lightly-doped drains 592 are disposed in the well 582 adjacent to the opposite sides of the high-k metal gate structure 55d. The source 594 and the drain 596 are respectively disposed in the lightly-doped drains 592 adjacent to the opposite sides of the high-k metal gate structure 55d. In some exemplary examples, the first transistor device 580 further includes two silicide layers 598, in which the silicide layers 598 are respectively disposed on the lightly doped drains 592, and are respectively located on the source 594 and the drain 596.

In the floating gate memory cell 520, the gate 544 of the first floating gate structure 540 and the gate 554 of the second floating gate structure 550 are disposed on the recesses 510b and 510c of the substrate 510, such that each of the first floating gate structure 540 and the second floating gate structure 550 has a recess channel, and the first floating gate structure 540 and the second floating gate structure 550 contact sidewalls of the common source 538. Since the first floating gate structure 540 and the second floating gate structure 550 contact sidewalls of the common source 538, a coupling ratio of the common source 538 to the floating gate structure 540/550, signals applied to the common source 538 can be effectively coupled to the first floating gate structure 540 and the second floating gate structure 550.

Figure 6A:
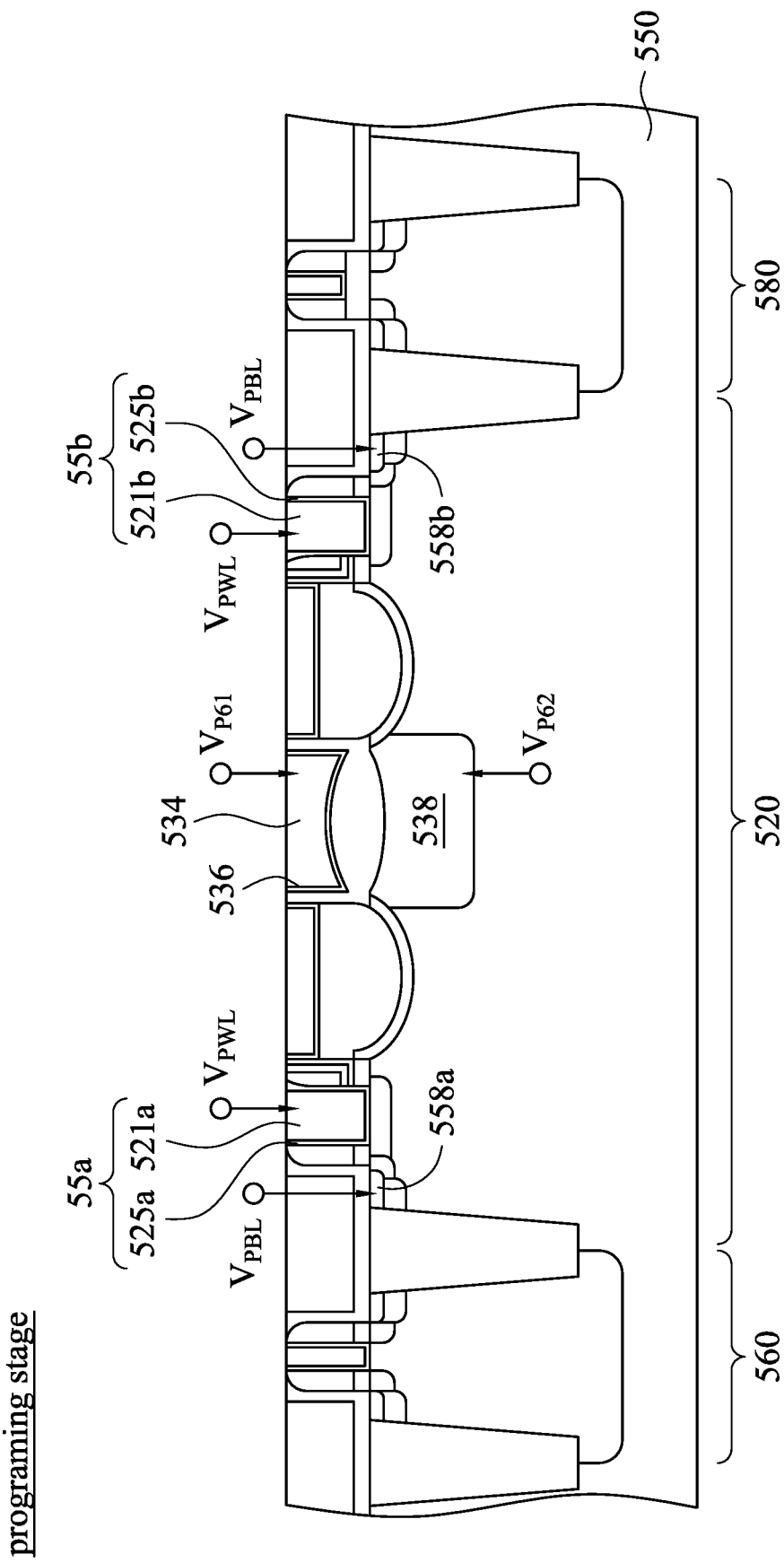
FIG. 6A and FIG. 6B are schematic diagrams showing voltage signals applied on the memory unit at a programing stage and an erasing stage in accordance with various embodiments of the present disclosure.
Figure 6B:
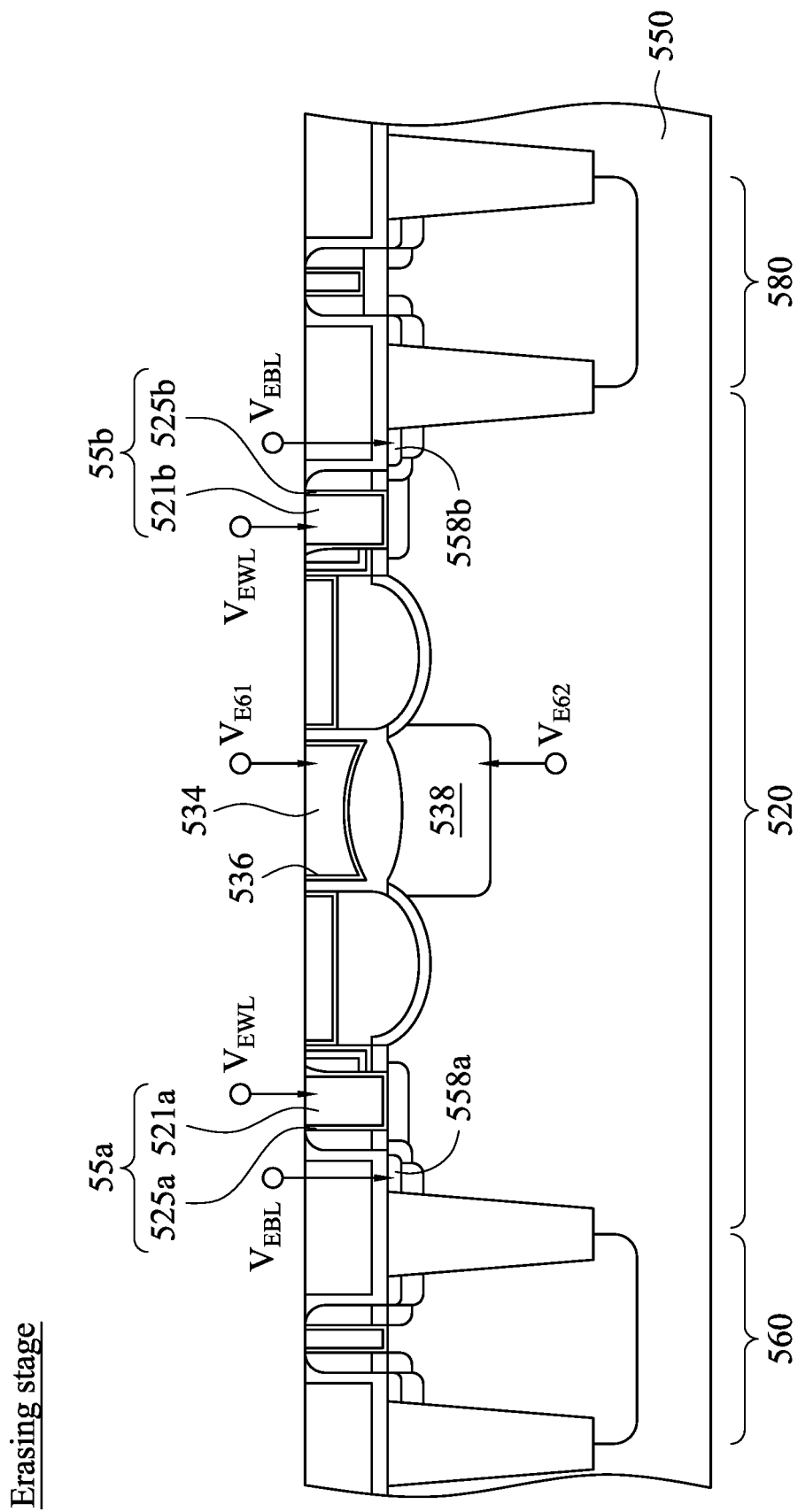

Referring to FIG. 6A and FIG. 6B, FIG. 6A and FIG. 6B are schematic diagrams showing voltage signals applied on the memory unit 500 at a programing stage and an erasing stage. The programming stage and the erasing stage of the memory unit 500 are similar to the programming stage and the erasing stage of the memory unit 200. For example, as shown in FIG. 6A, when the memory unit 500 is programed, a programming voltage $V_{PEG}$ is applied on the erase gate structure 530, a programming voltage $V_{PCG}$ is applied on the common source 538, the bit line programming voltage $V_{PBL}$ is applied on the drains 517a and 517b of the floating gate memory cell 520, and the word line programming voltage $V_{PWL}$ is applied on the select gates 521a and 521b of the floating gate memory cell 520. For another example, as shown in FIG. 6B, when the memory unit 500 is erased, an erasing voltage $V_{EEG}$ is applied on the erase gate structure 530, an erasing voltage $V_{ECG}$ is applied on the common source 538, the bit line erasing voltage $V_{EBL}$ is applied on the drains 517a and 517b of the floating gate memory cell 520, and the word line erasing voltage $V_{EWL}$ is applied on the select gates 521a and 521b of the floating gate memory cell 520, in which the erasing voltage $V_{EEG}$ is equal to the erase gate programming voltage $V_{EEG}$, and the erasing voltage $V_{ECG}$ is equal to the control gate erasing voltage $V_{ECG}$.

In the above embodiments, a first sub cell 520a including the first floating gate structure 540 and a second sub cell 520b including the second floating gate structure 550 are programed simultaneously, but embodiments of the present disclosure are not limited thereto. In some embodiments, the first sub cell 520a and the second sub cell 520b can be programmed individually.

In accordance with an embodiment of the present disclosure, a method for controlling a memory device is provided. In the method, at first, the memory device is provided. The memory device includes plural memory units and plural control circuits. Each of the memory units includes a floating gate memory cell disposed on a substrate. The floating gate memory cell includes an erase gate structure, a floating gate structure, and a common source. The erase gate structure is disposed on a surface of the substrate. The common source is disposed in the substrate and underlying the erase gate structure. The floating gate structure protrudes from a recess of the substrate and abutting the erase gate structure. The floating gate structure abuts the erase gate structure and the common source. After providing the memory device, a programing stage is performed to program at least one of the memory units by using the control circuits. The programing stage includes applying an erase gate programming voltage on the erase gate structure and applying a control gate programming voltage on the common source. The control gate programming voltage is greater than the erase gate programming voltage.

In accordance with one embodiment, the control gate programming voltage is ranged from substantially 8 volts to 18 volts.

In accordance with one embodiment, the erase gate programming voltage is ranged from substantially 0 volts to 8 volts.

In accordance with one embodiment, the programing stage further comprises applying a bit line programming voltage on a drain of the floating gate memory cell.

In accordance with one embodiment, he programing stage further comprises applying a word line programming voltage on a select gate of the floating gate memory cell.

In accordance with one embodiment, the method further including performing an erasing stage to erase the at least one memory units by using the control circuits. The erasing stage further including applying an erase gate erasing voltage on the erase gate structure, applying a control gate erasing voltage on the common source, applying a bit line erasing voltage on the drain of the floating gate memory cell, and applying a word line erasing voltage on the select gate of the floating gate memory cell. The control gate erasing voltage is lower than the erase gate programming voltage.

In accordance with one embodiment, the erase gate programming voltage is ranged from substantially 8 volts to 15 volts.

In accordance with one embodiment, the control gate erasing voltage is ranged from substantially −1 volts to 1 volts.

In accordance with one embodiment, the bit line erasing voltage and the word line erasing voltage are ranged from substantially 0 volts to 8 volts.

In accordance with an embodiment of the present disclosure, a memory device is provided. The memory device includes a floating gate memory cell disposed on a substrate. The floating gate memory cell includes a common source, an erase gate structure, a first floating gate structure, a second floating gate structure, a first select gate and a second select gate. The common source is disposed in the substrate. The erase gate structure is disposed on the common source. The erase gate structure is disposed on the common source. The first floating gate structure and the second floating gate structure are disposed at two opposite sides of the erase gate structure. The first floating gate structure and the second floating gate structure abut the erase gate structure and the common source, and protrude from recesses of the substrate. The first select gate is disposed adjacent to the first floating gate structure. The first select gate and the erase gate structure are disposed at two opposite sides of the first floating gate structure. The second select gate is disposed adjacent to the second floating gate structure. The second select gate and the erase gate structure are disposed at two opposite sides of the second floating gate structure.

In accordance with one embodiment, the memory device further includes control circuits configured to provide an erase gate programming voltage and a control gate programming voltage for a programming stage. The erase gate structure is electrically connected to at least one of the control circuits to receive the erase gate programming voltage in the programming stage, and the common source is electrically connected to at least one of the control circuits to receive the control gate programming voltage in the programming stage.

In accordance with one embodiment, the control gate programming voltage is ranged from substantially 8 volts to 18 volts.

In accordance with one embodiment, the erase gate programming voltage is ranged from substantially 0 volts to 8 volts.

In accordance with one embodiment, the control circuits are further configured to provide a word line programming voltage for the programming stage. The first select gate and the second select gate are electrically connected to at least one of the control circuits to receive the word line erasing voltage in the programming stage.

In accordance with one embodiment, the control circuits are further configured to provide an erase gate erasing voltage, a control gate erasing voltage, and a word line erasing voltage for an erasing stage. The erase gate structure is electrically connected to at least one of the control circuits to receive the erase gate erasing voltage in the erasing stage. The common source is electrically connected to at least one of the control circuits to receive the control gate erasing voltage in the erasing stage. The first select gate and the second gate are electrically connected to at least one of the control circuits to receive the word line erasing voltage in the erasing stage.

In accordance with one embodiment, the erase gate erasing voltage is ranged from substantially 8 volts to 15 volts.

In accordance with one embodiment, the control gate erasing voltage is ranged from substantially −1 volts to 1 volts.

In accordance with one embodiment, the bit line erasing voltage and the word line erasing voltage are ranged from substantially 0 volts to 8 volts.

In accordance with an embodiment of the present disclosure, a memory device is provided. The memory device includes plural control circuits and plural memory units disposed on a substrate. The control circuits are configured to provide an erase gate programming voltage and a control gate programming voltage for a programming stage. Each of the memory units includes plural isolation structures and a floating gate memory cell. The isolation structures are disposed in the substrate to at least define a first region. The floating gate memory cell is disposed in the first region. The floating gate memory cell includes an erase gate structure, a first floating gate structure, a second floating gate structure and a common source. The erase gate structure is disposed on the surface of the substrate for receiving the erase gate programming voltage. The first floating gate structure and the second floating gate structure protrude from recesses of the substrate and are located at two opposite sides of the erase gate structure. The common source is disposed in the substrate between the first floating gate structure and the second floating gate structure for receiving the control gate programming voltage. The control gate programming voltage is greater than the erase gate programming voltage during the programming stage.

In accordance with one embodiment, each of the memory units further includes a first transistor device and a second transistor device, wherein the isolation structures further define a second region and a third region on the substrate, the first transistor device is disposed in the second region, and the second transistor device is disposed in the third region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for controlling a memory device, the method comprising:
    providing the memory device comprising a plurality of memory units and a plurality of control circuits, and each of the memory units comprises:
        a floating gate memory cell disposed on a substrate, wherein the floating gate memory cell comprises:
            an erase gate structure disposed on a surface of the substrate;
            a common source disposed in the substrate and underlying the erase gate structure; and a floating gate structure protruding from a recess of the substrate, wherein the floating gate structure abuts the erase gate structure and the common source;

performing a programing stage to program at least one of the memory units by using the control circuits, wherein the programing stage comprises:

applying a first voltage on the erase gate structure; and
applying a second voltage on the common source, wherein the second voltage is greater than the first voltage, and the second voltage is in a range from about 8 volts to about 18 volts.

2. The method of claim 1, wherein the first voltage is ranged from substantially 0 volts to 8 volts.

3. The method of claim 1, wherein the programing stage further comprises applying a bit line programming voltage on a drain of the floating gate memory cell.

4. The method of claim 1, wherein the programing stage further comprises applying a word line programming voltage on a select gate of the floating gate memory cell.

5. The method of claim 1, further comprising performing an erasing stage to erase the at least one of the memory units by using the control circuits, wherein the erasing stage comprises:

applying an erase gate erasing voltage on the erase gate structure;
applying a control gate erasing voltage on the common source, wherein the control gate erasing voltage is lower than the first voltage;
applying a bit line erasing voltage on a drain of the floating gate memory cell; and
applying a word line erasing voltage on a select gate of the floating gate memory cell.

6. The method of claim 5, wherein the erase gate erasing voltage is ranged from substantially 8 volts to 15 volts.

7. The method of claim 5, wherein the control gate erasing voltage is ranged from substantially −1 volts to 1 volts.

8. The method of claim 5, wherein the bit line erasing voltage and the word line erasing voltage are ranged from substantially 0 volts to 8 volts.

9. A memory device, comprising:
a common source disposed in the substrate;
an erase gate structure disposed on the common source;
a first floating gate structure and a second floating gate structure disposed at two opposite sides of the erase gate structure, wherein the first floating gate structure and the second floating gate structure abut the erase gate structure and the common source, and protrude from recesses of the substrate, and a bottom of the first floating gate structure is lower than a top of the common source;
a first select gate disposed adjacent to the first floating gate structure, wherein the first select gate and the erase gate structure are disposed at two opposite sides of the first floating gate structure; and
a second select gate disposed adjacent to the second floating gate structure, wherein the second select gate and the erase gate structure are disposed at two opposite sides of the second floating gate structure.

10. The memory device of claim 9, further comprising a plurality of control circuits configured to provide an erase gate programming voltage and a control gate programming voltage for a programming stage, wherein the erase gate structure is electrically connected to at least one of the control circuits to receive the erase gate programming voltage in the programming stage, and the common source is electrically connected to at least one of the control circuits to receive the control gate programming voltage in the programming stage.

11. The memory device of claim 10, wherein the control gate programming voltage is ranged from substantially 8 volts to 18 volts.

12. The memory device of claim 10, wherein the erase gate programming voltage is ranged from substantially 0 volts to 8 volts.

13. The memory device of claim 10, wherein
the control circuits are further configured to provide a word line programming voltage for the programming stage; and the first select gate and the second select gate are electrically connected to at least one of the control circuits to receive the word line programming voltage in the programming stage.

14. The memory device of claim 13, wherein
the control circuits are further configured to provide an erase gate erasing voltage, a control gate erasing voltage, and a word line erasing voltage for an erasing stage;
the erase gate structure is electrically connected to at least one of the control circuits to receive the erase gate erasing voltage in the erasing stage;
the common source is electrically connected to at least one of the control circuits to receive the control gate erasing voltage in the erasing stage; and
the first select gate and the second select gate are electrically connected to at least one of the control circuits to receive the word line erasing voltage in the erasing stage.

15. The memory device of claim 14, wherein the erase gate erasing voltage is ranged from substantially 8 volts to 15 volts.

16. The memory device of claim 14, wherein the control gate erasing voltage is ranged from substantially −1 volts to 1 volts.

17. The memory device of claim 14, wherein the word line erasing voltage are ranged from substantially 0 volts to 8 volts.

18. The memory device of claim 9, wherein the bottom of the first floating gate structure is lower than a bottom of the first select gate.

19. A memory device, comprising:
a plurality of control circuits configured to provide an erase gate programming voltage and a control gate programming voltage for a programming stage;
a substrate having a first channel region and a second channel region, wherein each of the first and second channel regions has a portion that has a concave top surface;
a plurality of memory units disposed on the substrate, wherein each of the memory units comprises:
a plurality of isolation structures disposed in the substrate to at least define a first region on the substrate; and
a floating gate memory cell disposed in the first region, wherein the floating gate memory cell comprises:
an erase gate structure disposed on a surface of the substrate for receiving the erase gate programming voltage;
a first floating gate structure and a second floating gate structure respectively directly above the concave top surfaces of the portions of the first and second channel regions and located at two opposite sides of the erase gate structure; and a common source disposed in the substrate between the first floating gate structure and the second floating gate structure for receiving the control gate programming voltage.

20. The memory device of claim 19, wherein each of the memory units further comprises a first transistor device and a second transistor device, wherein the isolation structures further define a second region and a third region on the substrate, the first transistor device is disposed in the second region, and the second transistor device is disposed in the third region.

\* \* \* \* \*